(12) United States Patent
Wares et al.

(10) Patent No.: US 8,304,644 B2
(45) Date of Patent: Nov. 6, 2012

(54) DEVICE AND METHOD FOR SOLAR POWER GENERATION

(75) Inventors: Brian Wares, Sacramento, CA (US); Stephan Barsun, Davis, CA (US); Tom Dinwoodie, Piedmont, CA (US)

(73) Assignee: SunPower Corporation, San Jose, CA (US)

( * ) Notice: Subject to any disclaimer, the term of this patent is extended or adjusted under 35 U.S.C. 154(b) by 378 days.

(21) Appl. No.: 12/622,764

(22) Filed: Nov. 20, 2009

(65) Prior Publication Data

US 2011/0120524 A1 May 26, 2011

(51) Int. Cl.
*H01L 31/052* (2006.01)

(52) U.S. Cl. ........ 136/246; 136/244; 136/259; 126/683; 126/684; 126/688; 126/690; 126/696; 126/701; 126/702

(58) Field of Classification Search ............... 136/243, 136/244, 246, 252, 259; 126/683, 684, 688, 126/690, 696, 701, 702
See application file for complete search history.

(56) References Cited

U.S. PATENT DOCUMENTS

| | | | |
|---|---|---|---|
| 4,153,474 A | 5/1979 | Rex | |
| 4,323,719 A | 4/1982 | Green | |
| 4,373,783 A | 2/1983 | Anderson | |
| 4,456,332 A | 6/1984 | Anderson | |
| 4,468,848 A | 9/1984 | Anderson et al. | |
| 4,468,849 A | 9/1984 | Anderson et al. | |
| 4,481,378 A | 11/1984 | Lesk | |
| 4,502,200 A | 3/1985 | Anderson et al. | |
| 4,640,734 A | 2/1987 | Roberts et al. | |
| 4,643,543 A | 2/1987 | Mohn et al. | |
| 4,643,544 A | 2/1987 | Loughran | |
| 4,759,803 A | 7/1988 | Cohen | |
| 5,180,441 A | 1/1993 | Cornwall et al. | |
| 5,248,346 A | 9/1993 | Fraas et al. | |
| 5,334,496 A | 8/1994 | Pond et al. | |
| 5,344,496 A | 9/1994 | Stern et al. | |
| 5,389,158 A | 2/1995 | Fraas et al. | |
| 5,409,549 A | 4/1995 | Mori | |

(Continued)

FOREIGN PATENT DOCUMENTS

DE 10041271 3/2002

(Continued)

OTHER PUBLICATIONS

Mohedano, et al. "Design of a Simple Structure for the D-SMTS Concentrator", 16th European Photovoltaic Solar Energy Conference, May 2000, pp. 2563-2566.*

(Continued)

*Primary Examiner* — Jonathan Johnson
*Assistant Examiner* — Christina Chern
(74) *Attorney, Agent, or Firm* — Knobbe, Martens, Olson & Bear, LLP

(57) ABSTRACT

A photovoltaic device comprising an array of elongate reflector elements mounted substantially parallel to one another and transversely spaced in series, at least one of the reflector elements having an elongate concave reflective surface to reflect incident solar radiation towards a forward adjacent reflector element in the array. The at least one reflector element includes a photovoltaic assembly which is removably and replaceably mounted on the reflector element. The photovoltaic assembly includes a photovoltaic receptor to receive reflected solar radiation from a rearward adjacent reflector element. The photovoltaic assembly also includes a heat sink in heat transfer relationship with the photovoltaic receptor, thermally isolating the photovoltaic receptor, at least partially, from the reflector element.

19 Claims, 8 Drawing Sheets

U.S. PATENT DOCUMENTS

| | | | |
|---|---|---|---|
| 5,498,297 | A | 3/1996 | O'Neill et al. |
| 5,580,395 | A | 12/1996 | Yoshioka et al. |
| 5,616,185 | A | 4/1997 | Kukulka |
| 5,660,644 | A | 8/1997 | Clemens |
| 5,697,192 | A | 12/1997 | Inoue |
| 5,865,905 | A | 2/1999 | Clemens |
| 5,899,199 | A | 5/1999 | Mills |
| 5,990,415 | A | 11/1999 | Green et al. |
| 6,034,322 | A | 3/2000 | Pollard |
| 6,131,565 | A | 10/2000 | Mills |
| 6,323,478 | B1 | 11/2001 | Fujisaki et al. |
| 6,359,209 | B1 | 3/2002 | Glenn et al. |
| 6,442,937 | B1 | 9/2002 | Stone |
| 6,553,729 | B1 | 4/2003 | Nath et al. |
| 6,635,507 | B1 | 10/2003 | Boutros et al. |
| 7,468,485 | B1 | 12/2008 | Swanson |
| 7,554,031 | B2 | 6/2009 | Swanson et al. |
| 7,709,730 | B2 | 5/2010 | Johnson et al. |
| 7,820,906 | B2 | 10/2010 | Johnson et al. |
| 7,825,327 | B2 | 11/2010 | Johnson et al. |
| D631,004 | S | 1/2011 | Johnson |
| 7,952,057 | B2 | 5/2011 | Johnson et al. |
| 7,968,791 | B2 | 6/2011 | Do et al. |
| 8,049,150 | B2 | 11/2011 | Johnson et al. |
| 2004/0074490 | A1 | 4/2004 | Mills et al. |
| 2007/0151598 | A1 | 7/2007 | De Ceuster et al. |
| 2007/0257274 | A1 | 11/2007 | Martter et al. |
| 2008/0035198 | A1 | 2/2008 | Teppe et al. |
| 2009/0056698 | A1 | 3/2009 | Johnson et al. |
| 2009/0056699 | A1 | 3/2009 | Mills et al. |
| 2009/0056785 | A1 | 3/2009 | Johnson et al. |
| 2009/0056786 | A1 | 3/2009 | Johnson et al. |
| 2009/0056787 | A1 | 3/2009 | Johnson et al. |
| 2009/0095284 | A1 | 4/2009 | Klotz |
| 2009/0139557 | A1 | 6/2009 | Rose et al. |
| 2010/0154788 | A1 | 6/2010 | Wells et al. |
| 2010/0163014 | A1 | 7/2010 | Johnson et al. |
| 2010/0175740 | A1 | 7/2010 | Johnson et al. |
| 2010/0193014 | A1 | 8/2010 | Johnson et al. |
| 2010/0236626 | A1 | 9/2010 | Finot et al. |
| 2010/0294336 | A1 | 11/2010 | Johnson et al. |
| 2010/0319682 | A1 | 12/2010 | Klotz |
| 2011/0023940 | A1 | 2/2011 | Do et al. |
| 2011/0186130 | A1 | 8/2011 | Finot et al. |
| 2011/0226309 | A1 | 9/2011 | Do et al. |
| 2011/0226310 | A1 | 9/2011 | Johnson et al. |

FOREIGN PATENT DOCUMENTS

| | | |
|---|---|---|
| DE | 202004005198 | 8/2004 |
| GB | 2340993 | 3/2000 |
| JP | 2007184542 | 7/2007 |
| JP | 2007194521 | 8/2007 |
| JP | 2007214247 | 8/2007 |
| KR | 1020070070183 | 7/2007 |
| KR | 1020090014153 | 2/2009 |
| WO | WO 9957493 | 11/1999 |
| WO | WO 2007096157 | 8/2007 |
| WO | WO 2007096158 | 8/2007 |
| WO | WO-2008/022409 A1 | 2/2008 |
| WO | WO-2008/153922 A1 | 12/2008 |
| WO | WO-2009/023063 A2 | 2/2009 |
| WO | WO-2009/029275 A2 | 3/2009 |
| WO | WO-2009/029277 A2 | 3/2009 |

OTHER PUBLICATIONS

Bardwell, Karen et al., "Minimizing End Shadowing Effects on Parabolic Concentrator Arrays," IEEE, 1980, pp. 765-770.

Carroll, Don et al. "Production of the Alpha Solarco Proof-of-Concept Array," IEEE, 1990, pp. 1136-1141.

Edenburn, Michael W., et al. "Shading Analysis of a Photovoltaic Cell String Illuminated by a Parabolic Trough Concentrator," IEEE, 1981, pp. 63-68.

Shepard, Jr., N. F. et al., "The Integration of Bypass Diodes with Terrestrial Photovoltaic Modules and Arrays," IEEE, 1984, pp. 676-681.

Stern, T. G., "Interim results of the SLATS concentrator experiment on LIPS-II (space vehicle power plants)," Photovoltaic Specialists Conference, 1988., Conference Record of the Twentieth IEEE , vol., No., pp. 837-840 vol. 2, 1988. URL: http://ieeexplore.ieee.org/stamp/stamp.jsp?tp=&arnumber=105822&isnumber=3239.

Vivar Garcia, Marta, "Optimisation of the Euclides Photovoltaic Concentrator," 2009, 390 pages.

* cited by examiner

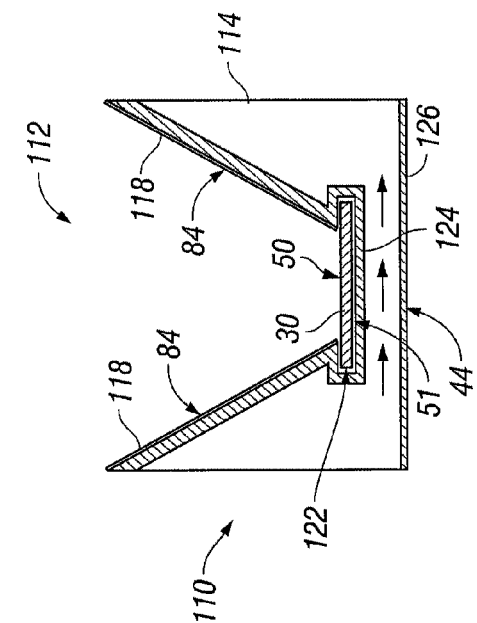
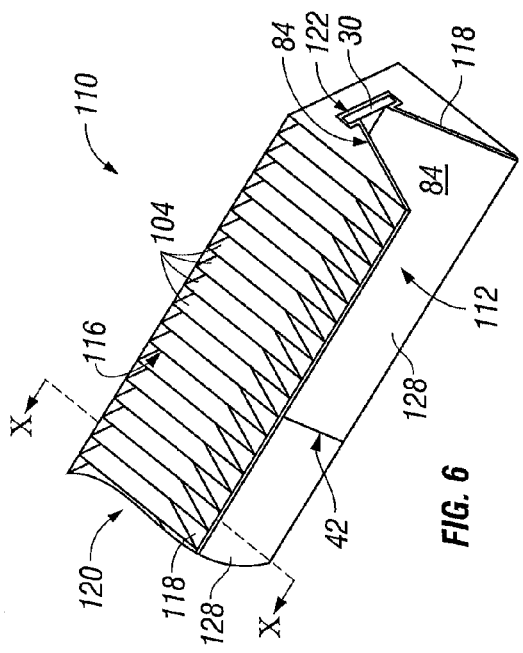
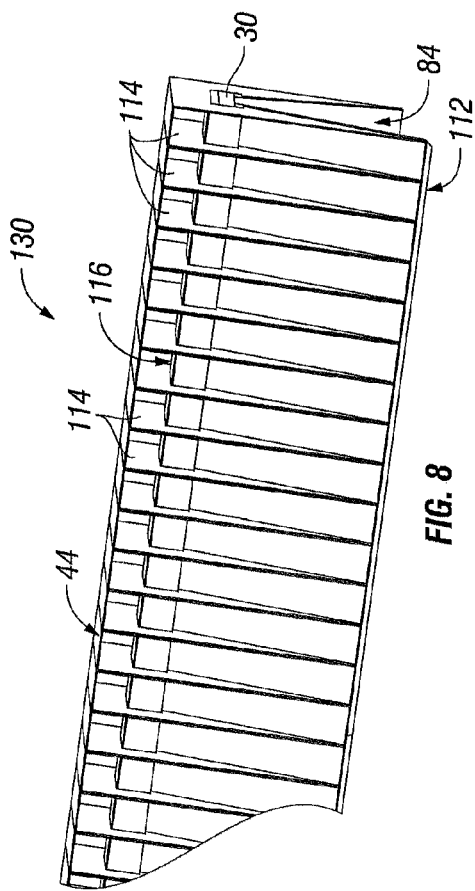

DEVICE AND METHOD FOR SOLAR POWER GENERATION

TECHNICAL FIELD

The present application relates generally to the technical field of solar power generation, in one specific example, to a photovoltaic device. The application extends to a mounting unit and to a method of converting solar radiation to electrical power.

BACKGROUND

Various devices and systems are known for use in harvesting solar energy by the use of photovoltaic cells. These include slat concentrators, which are photovoltaic devices generally comprising a series of parallel trough-shaped off axis parabolic reflectors to concentrate sunlight on photovoltaic receptors mounted on respective adjacent reflectors. The reflectors are typically automatically actuated to track the sun in order to ensure accurate reflection and concentration of solar radiation on the photovoltaic receptors.

The photovoltaic receptors forming part of such concentrators have a limited lifespan and the photovoltaic devices therefore require periodic removal and replacement of the photovoltaic receptors. There is a relationship between the operating temperatures of the photovoltaic receptors and their lifespan. Additionally, a photovoltaic receptor generally displays higher efficiency at lower temperatures.

SUMMARY

In accordance with a first embodiment there is provided a photovoltaic device comprising an array of elongate reflector elements mounted substantially parallel to one another and transversely spaced in series, at least one of the reflector elements having an elongate concave reflective surface to reflect incident solar radiation towards a forward adjacent reflector element in the array. The at least one reflector element includes a photovoltaic receptor mounted on the reflector element by a mounting arrangement to receive reflected solar radiation from a rearward adjacent reflector element. The reflector element also includes a heat sink in heat transfer relationship with the photovoltaic receptor, thermally isolating the photovoltaic receptor, at least partially, from the reflector element.

In one embodiment, the photovoltaic receptor may be spaced from the associated reflector element, providing a convection gap between the associated reflector element and the photovoltaic receptor, the heat sink being located, at least partially, in the convection gap.

The heat sink may form part of a photovoltaic assembly which is removably and replaceably mounted on the associated reflector element, the photovoltaic assembly further including the photovoltaic receptor and the mounting arrangement. By removable and replaceable mounting is meant that the mounting is by a non-permanent connection which facilitates regular removal and replacement of the photovoltaic assembly without damage to either the photovoltaic assembly or the reflector element on which it is mounted.

The heat sink may include a set of cooling fins located between the photovoltaic receptor and the associated reflector element. A mounting arrangement may include a thermal expansion arrangement to compensate for varying rates of thermal expansion and contraction of the photovoltaic receptor and the mounting arrangement.

In accordance with a further embodiment, the reflector element includes a secondary optic device directing solar radiation reflected on to it by a rearward adjacent reflector element on to the associated photovoltaic receptor. The secondary optic device may include a secondary reflector mounted on the reflector element adjacent the photovoltaic receptor.

According to yet a further embodiment, there may be provided a photovoltaic device comprising: an array of elongate reflector elements mounted substantially parallel to one another and transversely spaced in series, at least one of the reflector elements having an elongate concave reflective surface disposed towards a concentrating zone located above the reflective surface; and a photovoltaic assembly mounted on a supporting member. The photovoltaic assembly may include a photovoltaic receptor held by the supporting member in the concentrating zone, and a heat sink in heat transfer relationship with the photovoltaic receptor, at least partially isolating the photovoltaic receptor thermally.

The photovoltaic assembly may be mounted on the supporting member such that the photovoltaic assembly is suspended from the supporting member. The supporting member may be a spar located in the concentrating zone. The heat sink may serve thermally to isolate the photovoltaic receptor, at least partially, from the supporting member. The photovoltaic receptor may also be thermally isolated from the reflector element. The suspending member may be connected to an associated reflector element.

BRIEF DESCRIPTION OF THE DRAWINGS

Some embodiments are illustrated by way of example and not limitation in the figures of the accompanying drawings, in which like reference numerals indicate like parts, unless otherwise indicated. In the drawings:

FIG. 6 is a partial three-dimensional view of a photovoltaic assembly forming part of a photovoltaic device in accordance with yet a further example embodiment.

FIG. 7 is a cross-sectional end view of the photovoltaic assembly in accordance with the example embodiment of FIG. 6, taken along line X-X in FIG. 6.

FIG. 8 is a partial three-dimensional view of a photovoltaic assembly forming part of a photovoltaic device in accordance with yet another example embodiment.

DETAILED DESCRIPTION

Example photovoltaic devices and solar power generation methods are described. In the following description, for purposes of explanation, numerous specific details are set forth in order to provide a thorough understanding of example embodiments. It will be evident, however, to one skilled in the art that the embodiments may be practiced without these specific details.

Figure 1:
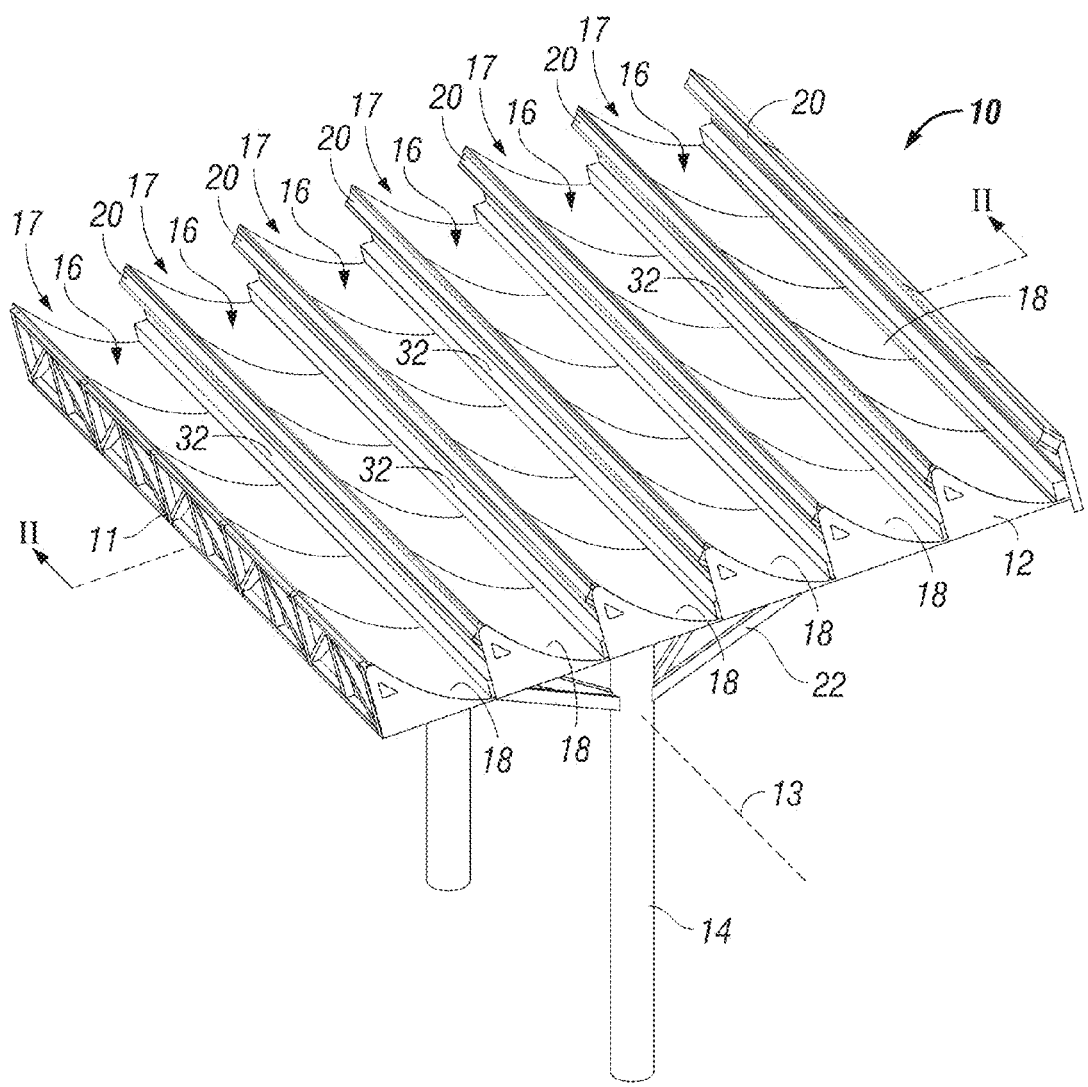
FIG. 1 is a three-dimensional view of a photovoltaic device in accordance with an example embodiment.

In the drawings, reference numeral 10 generally indicates a photovoltaic device in accordance with an example embodiment. As can be seen in FIG. 1 of the drawings, the device 10 is a slat concentrator comprising an array of reflector troughs or reflector elements 17 which are mounted on a rigid frame 11. The frame 11 is displaceably connected by struts 22 to an anchored support in the form of a pair of pylons 14. In particular, the frame 11 may be pivotally displaceable about an operatively horizontal axis 13 to permit tracking of the sun, in order to assist with optimal orientation of the reflector elements 17 relative to the sun. The device 10 further includes a control arrangement to control pivotal displacement of the frame 11 about the axis 13.

The reflector elements 17 are substantially parallel to one another, being transversely spaced in series at regular intervals, so that longitudinal axes of the respective reflector elements 17 lie in a common plane. A reflector element 17 includes a mirror or reflective surface 16 to reflect and concentrate incident solar radiation or sunlight 54 on to a photovoltaic receptor 30 (see FIGS. 3-5) forming part of a photovoltaic assembly 20 mounted on a forward adjacent reflector element 17.

In an example embodiment, one or more reflector elements 17 includes an elongate plate member 18 of sheet material or plate material, the plate member 18 being held in place by a mirror support 24 (see FIG. 3) and a bottom support 32 connected respectively to a top edge and a bottom edge of the plate member 18. The mirror support 24 and the bottom support 32 extend between side rails 12 forming part of the frame 11, being fast with side rails 12. An upwardly directed surface of the plate member 18 has a reflective covering or coating, thus providing the reflective surface 16. In other embodiments, the reflective surface 16 may be provided by a mirror. The plate member 18 is curved, so that the reflective surface 16 is concave and has a constant cross-sectional profile along its length. In an option, each plate member 18 is curved. The reflector element 17 may provide an off-axis cylindrical parabolic minor.

Figure 2:
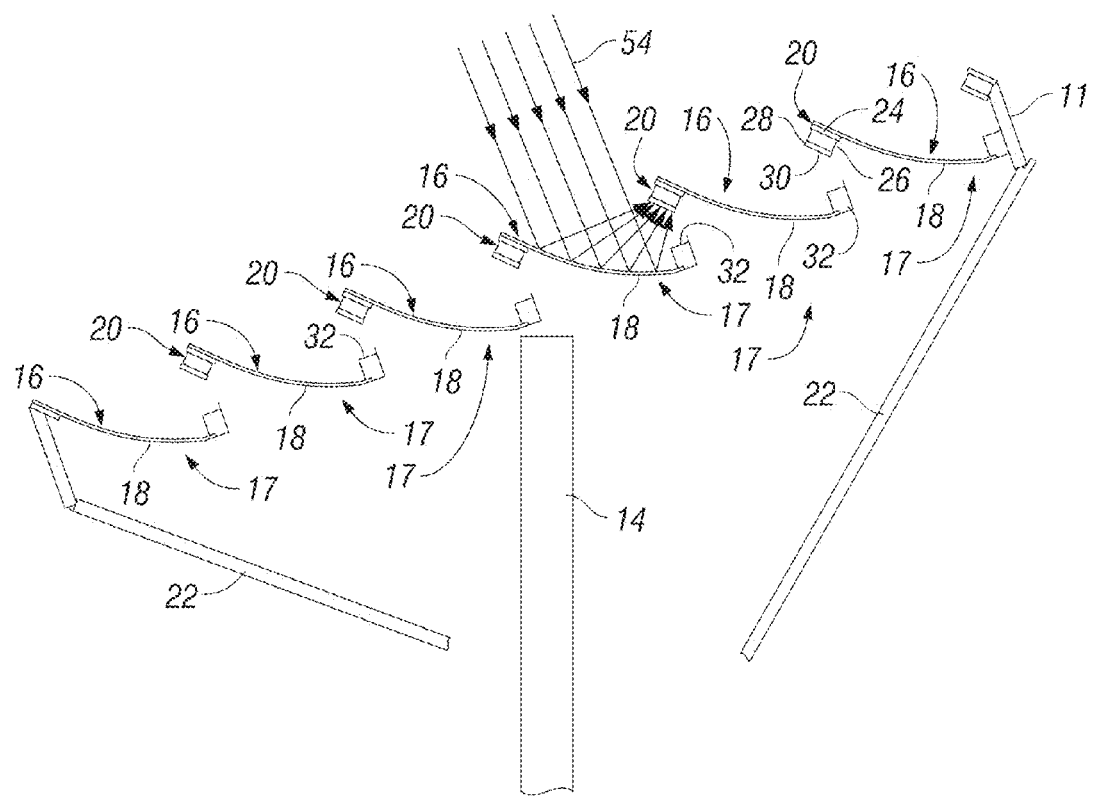
FIG. 2 is a sectional side view of the photovoltaic device in accordance with the example embodiment of FIG. 1, taken along line II-II in FIG. 1.

As can be seen in FIG. 2, the reflector elements 17 are positioned such that the respective reflective surfaces 16 reflect and concentrate incident sunlight 54 on the photovoltaic assembly 20 mounted on the top edge of the forward adjacent plate member 18. For ease of illustration, the path traveled by incident sunlight 54 reflected by the reflective surfaces 16 is shown for only one of the reflector elements 17. Because the reflective surface 16 is elongate and has a constant sectional profile, the reflective surface 16 reflects and concentrates sunlight 54 on to a longitudinally extending target band on a rear of its forward adjacent reflector element 17. In an example embodiment, the reflective surfaces 16 have a concentration ratio of about 10, by which is meant that the area of the target band is ¹⁄₁₀ the area of incident sunlight on the reflective surface 16.

Figure 3:
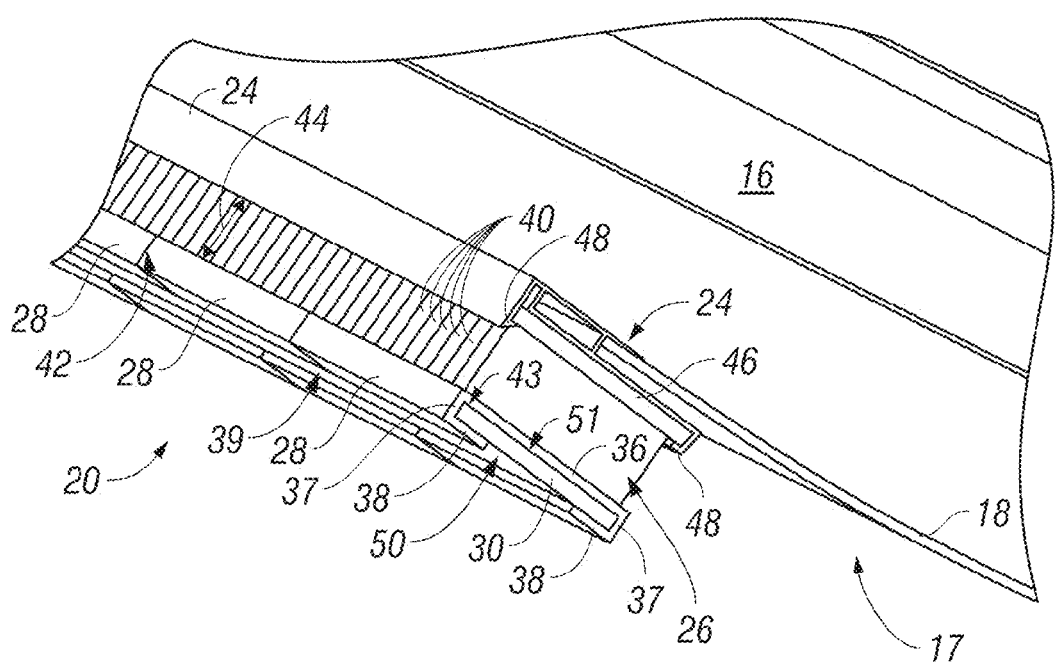
FIG. 3 is a three-dimensional view, on an enlarged scale, of part of a reflector element forming part of a photovoltaic device in accordance with the example embodiment of FIG. 1.
Figure 4:
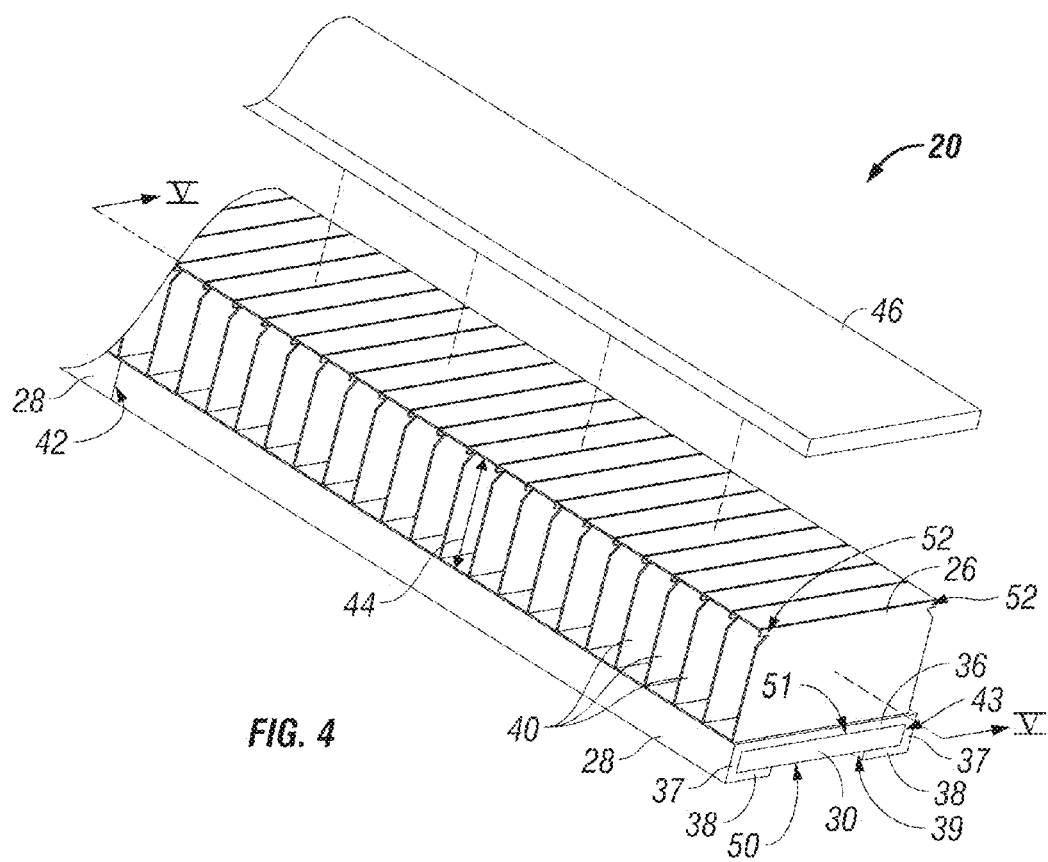
FIG. 4 is partial, exploded three-dimensional view of a photovoltaic assembly forming part of a photovoltaic device in accordance with the example embodiment of FIG. 1.

The photovoltaic assembly 20 includes a photovoltaic receptor in the form of an elongate photovoltaic laminate or strip 30 of photovoltaic cells (see FIGS. 2-4). The photovoltaic strip 30 is mounted on the respective reflector element 17 by a mounting arrangement, which holds the photovoltaic strip 30 in position such that an active face 50 (FIG. 4) of the photovoltaic strip 30 is located in the target band of sunlight 54 reflected by the reflective surface 16 of a rearward adjacent reflector element 17. The photovoltaic strip 30 converts solar energy into electrical power.

The photovoltaic assembly 20 includes a heat sink 26 which is in heat transfer relationship with the photovoltaic strip 30, thermally isolating the photovoltaic receptor 30 from the reflector element 17 on which it is mounted. By "heat sink" is meant an object or system that absorbs and dissipates heat in order to protect heat-sensitive components. The heat sink 26 includes a heat sink base in the form of a photovoltaic receptor holder provided by a series of holder sections 28 which are longitudinally aligned end-to-end. As can best be seen in FIGS. 3 and 4, the holder section 28 comprises a flat backing plate 36, a pair of shallow webs 37 which project perpendicularly away from opposite side edges of the backing plate 36, and a pair of lips 38 which are parallel to the backing plate 36 and project towards each other from lower edges of the webs 37, to define between them a longitudinally extending slit 39 exposing the active face 50 of the strip 30.

The holder section 28 thus defines a shallow rectangular holding cavity which is complementary in cross-sectional profile to the cross-sectional outline of the photovoltaic strip 30. The holder sections 28 have open ends, so that the respective holding cavities of the sections 28 together define an elongate slot 43 in which the photovoltaic strip 30 is matingly received. The active face 50 of the photovoltaic strip 30 is in register with the slit 39 for receiving reflected and concentrated sunlight 54, while a reverse face 51 of the photovoltaic strip 30 bears against the backing plate 36. The reverse face 51 of the photovoltaic strip 30 may be bonded to the backing plate 36 by a thermally conductive adhesive, to permit conductive heat transfer between the strip 30 and the backing plate 36. Because the holder sections 28 have constant cross-sectional profiles and open ends, the photovoltaic strip 30 may be slidingly receivable, socket/spigot fashion, in the composite holder formed by the sections 28.

The lips 38 bear against the active face 50 of the photovoltaic strip 30, anchoring the strip 30 against movement transversely away from the backing plate 36. Portions of the active face 50 adjacent its side edges are obscured by the lips 38, such that solar cells on the active face 50 of the photovoltaic strip 30 may be concentrated in a central longitudinally extending band which is in register with the slit 39. As can be seen in FIGS. 2 and 3, the photovoltaic strip 30 is mounted by the holder formed by the sections 28 on the associated plate member 18 to face rearwards and downwards at an angle towards the rearward adjacent reflector element 17. The strip 30 is mounted on the associated reflector element 17 such that the target band of the rearward adjacent reflective surface 16 coincides with the slit 39 of the holder provided by the holder sections 28.

Adjacent ends of neighboring holder sections 28 are spaced by a thermal expansion gap 42. The series of expansion gaps 42 form a thermal expansion arrangement to compensate for thermal expansion of the photovoltaic strip 30 and the sections 28 of the composite holder at differing rates. In an example embodiment, the holder sections 28 are of a metal with a relatively high thermal conductivity coefficient, for instance being of aluminum, while the strip 30 is a laminate, which may include a layer of glass. In other embodiments, the holder may, instead of being comprised of separate sections 28, be of monolithic or unitary construction while still including a thermal expansion arrangement such as, for example, regularly spaced openings or cuts.

Figure 5:
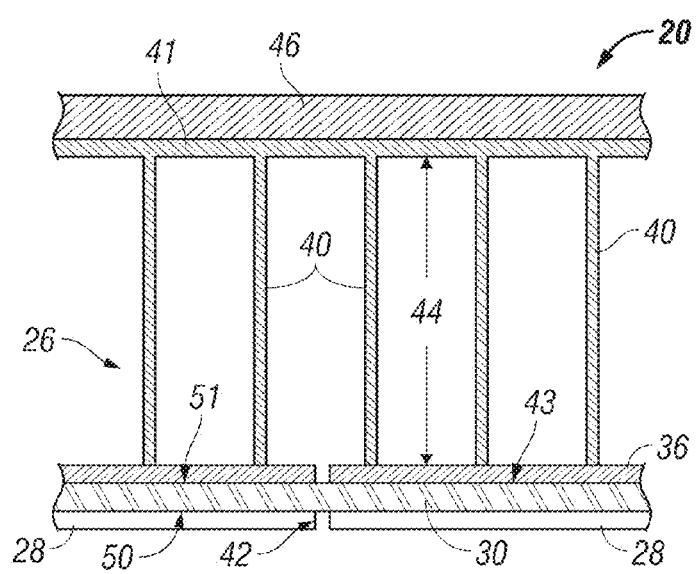
FIG. 5 is a longitudinal sectional view of a photovoltaic assembly in accordance with the example embodiment of FIG. 4, taken along line V-V in FIG. 4.

In an embodiment, the heat sink 26 is in the form of a set of metal cooling fins 40. The fins 40 are parallel to one another and are transversely spaced in a series which extends along at least a portion of the length of the associated reflector element 17 (FIGS. 3 and 5). The fins 40 therefore lie in respective operatively upright planes. The fins 40 may be disposed perpendicularly to the longitudinal axis of the plate member 18, so that, when the plate member 18 is disposed horizontally, the fins 40 are oriented vertically, to permit the passage of rising air through gaps between the fins 40. The set of cooling fins 40 is constructed such that, in longitudinal section, the fins 40 describe successive U-shaped profiles, so that the fins 40 project cantilever-fashion from a base 41. The base 41 of the set of fins 40 is connected face-to-face to a stiffening plate 46 which, in turn, is mounted on the associated plate member 18, as described in more detail below. The fins 40 are therefore anchored at their proximal ends, the holder sections 28 being connected to free or distal ends of the fins 40. In other words, the holder section 28 is connected to a bed of a fin end edges which respectively extend transversely across the width of the holder section 28. As can be seen in FIG. 4, the sections 28 and the fins 40 are more or less equal in width. With reference to FIG. 5, it will be noted that the thermal expansion gaps 42 are positioned between adjacent fins 40. Provision of the expansion gaps 42 permits some movement of holder sections 28 in their longitudinal direction relative to the stiffening plate 46, by elastic cantilevered flexing of the fins 40 connected to the holder sections 28. The structural unit formed by the stiffening plate 46, the set of cooling fins 40, and the holder sections 28 is therefore uninterrupted on one side, i.e. at the stiffening plate 46, while having regularly spaced breaks or interruptions provided by the thermal expansion gaps 42 on an opposite side.

The cooling fins 40 form part of the mounting arrangement, spacing the holder and the photovoltaic strip 30 from the associated plate member 18 to form a convection gap 44 between the stiffening plate 46 and the heat sink base 28. This allows cooling of the fins 40, and hence cooling of the heat sink base 28 and the photovoltaic strip 30, by the passage of air due to natural convection through the convection gap 44.

In other embodiments, a set of cooling fins forming the heat sink may have a different construction. For example, the fins may be formed through moulding, casting or extrusion. The set of fins may instead be folded fins, for instance a continuous folded metal strip, or the fins may be stacked or skived fins. In yet other embodiments, the heat sink may be provided by pin fins.

The photovoltaic strip 30, the holder sections 28, the heat sink 26 and the stiffening plate 46 together form the photovoltaic assembly 20 which is a structural unit and functions as a modular element, being removably and/or replaceably mounted on the associated plate member 18. In an example embodiment, the modular assembly 20 is mounted on the plate member 18 by the minor support 24 (FIG. 3). The minor support 24 is, in an option, in the form of an extrusion which extends along the length of the plate member 18 and defines a recess which receives an upper edge of the plate member 18, to connect the mirror support 24 to the plate member 18 at its upper edge. The minor support 24 also has a snapfit formation in the form of a pair of longitudinally extending lips or snap lugs 48 which are in snapfit engagement with the modular assembly 20, to hold the modular assembly 20 in position. As can be seen in FIG. 4, the modular assembly 20 includes a complementary snapfit formation comprising snap recesses or notches 52 in both side edges of the cooling fins 40 adjacent their proximal ends, to receive the complementarily shaped snap lugs 48. The notches 52 thus provide a connection arrangement for removably and replaceably connecting the assembly 20 to the minor support 24. The minor support 24 performs the dual functions of, on the one hand, supporting an upper edge of the plate member 18, and, on the other hand, connecting the assembly 20 to the plate member 18.

In use, the frame 11 is controlled by a control arrangement to track the sun by pivotal displacement of the frame 11 about the pivot axis 13. Incident sunlight 54 is reflected and concentrated by the reflective surface 16 on to the photovoltaic assembly 20 mounted on the neighboring reflector element 17 in front of it. The concave parabolic reflective surface 16 concentrates sunlight 54 falling on it on to a target band coinciding with the composite slit 39 in the holder sections 28 of the forward adjacent reflector element 17. The sunlight 54 is therefore reflected and concentrated on the active face 50 of the adjacent photovoltaic strip 30 exposed by the slit 39, resulting in the generation of electric power by the photovoltaic strip 30.

Due to its exposure to and absorption of concentrated sunlight 54, the photovoltaic strip 30 increases in temperature. Excessive heating of the photovoltaic strip 30 may adversely affect its conversion efficacy and life expectancy. However, the photovoltaic strip 30 is cooled, in use, by heat exchange with the heat sink 26. Heat is transferred from the photovoltaic strip 30 by conduction to the backing plates 36 with which the strip 30 is in thermally conductive contact. It will be appreciated that the photovoltaic strip 30 will tend to separate from the backing plate 36 under gravity, owing to the orientation of the assembly 20, and that the provision of a thermally conductive bonding between the reverse face 51 of the strip 30 and the backing plates 36 promotes thermal conduction between the strip 30 and the backing plates 36.

The backing plates 36 are in turn connected to the cooling fins 40 in a conductive heat transfer relationship, so that heat received by the backing plates 36 is transferred to the cooling fins 40. The cooling fins 40 are cooled by ambient air passing through gaps between the cooling fins 40 due to natural convection. Excessive heat in the photovoltaic strip 30 is thus dissipated by the heat sink 26. Such passive cooling due to convection is promoted by the upright orientation of the cooling fins 40 and positioning of the modular assemblies 20 near top edges of the plate members 18. Rising air is thus guided by an underside of each plate member 18 towards and through the cooling fins 40, while upright orientation of the cooling fins 40 results in minimal baffling or obstruction of air passing through the heat sink 26.

In use, the photovoltaic strip 30 and the holder sections 28 experience temperature variations and consequently change in length due to thermal expansion and contraction. However, the strip 30 and holder sections 28 expand and contract at different rates, owing to differences in their material properties. The expansion gaps 42 compensate for thermal expansion and contraction of the strip 30 and the holder sections 28 at different rates, to ameliorate internal stresses in the photovoltaic strip 30. It is to be noted that connection of the holder sections 28 to the distal ends of the fins 40 allows substantially unrestrained lengthening and shortening of the holder sections 28, as well as longitudinal movement of the holder sections 28 relative to one another, due to cantilevered elastic flexing of the fins 40.

Removable and replaceable mounting of the modular assemblies 20 on the plate members 18 facilitates removal and replacement of the photovoltaic strip 30. When a strip 30 reaches the end of its lifetime, the modular assembly 20 is removed as a unit and is replaced by a photovoltaic assembly 20 with a new photovoltaic strip 30. Such removal and replacement of the photovoltaic assemblies 20 is achieved by snapfit engagement of the snap lugs 48 with the notches 52.

Furthermore, the holder sections 28, the cooling fins 40 and the stiffening plate 46 forms a mounting unit which is reusable by removal and replacement of the photovoltaic strip 30. Such removal and replacement is achieved by sliding movement of the strip 30 in the slot 39 provided for it by the aligned holder sections 28.

The example embodiment extends to a solar power installation (not shown) or solar power plant comprising a multitude of the photovoltaic devices 10 installed in a common location and electrically connected together for the generation of electrical power. It is to be noted that ready removal and replacement of the photovoltaic assemblies 20 is particularly advantageous in such a solar power installation, as it reduces on-site maintenance loads.

FIGS. 6 and 7 illustrate another embodiment of a modular photovoltaic assembly 110 for mounting on a reflector element in a photovoltaic device similar to the device 10 illustrated in FIGS. 1-5. The modular assembly 110 of FIGS. 6 and 7 combines the provision of a heat sink 116 between a photovoltaic strip 30 and an associated reflector element (not shown in FIGS. 6-8) with the provision of a secondary optic device to direct sunlight which falls on the secondary optic device on to a photovoltaic strip 30.

The secondary optic device of the modular assembly 110 includes a splayed U-shaped recess 112 with reflective longitudinally extending side walls 84, the photovoltaic strip 30 being mounted at a base of the recess 112 such that its active face 50 is directed outwardly. The recess side walls 84 is provided by respective inclined plates 118 extending longitudinally along the assembly 110 and having reflective coatings or coverings 84. The inclined plates 118 are fast with a holder 120 that defines a longitudinally extending slot 122 in which the photovoltaic strip 30 is complementarily received such that the reverse face 51 of the strip 30 bears against a backing plate 124 forming part of the holder 120.

The assembly 110 further includes a heat sink 116 in the form of a set of cooling fins 114 which, in operation, have an upright orientation and space the backing plate 124 from a reflector element on which the assembly 110 is mounted, forming a convection gap 44 (see FIG. 7) between the backing plate 124 and a fin base 126 to which the fins 114 are fixed cantilever-fashion. The fins 114 are connected not only to the holder 120, but also to the inclined plates 118, to form buttress-like supports for the inclined plates 118.

Similar to the embodiment described with reference to FIGS. 1-5, holder 120 may comprise sections 128 separated by thermal expansion gaps 42, the expansion gaps 42 extending through the inclined plates 118. Each holder section 128 is fast with the cooling fins 114. Although not shown in FIGS. 6-8, the cooling fins 114 may be connected together and supported by a stiffening plate similar to the stiffening plate 46 of FIGS. 4 and 5.

In operation, the modular assembly 110 functions similarly to the modular assembly 20 of FIGS. 1-5, with the additional feature that the modular assembly 110 includes a secondary optic device provided by the reflective inclined plates 118. Sunlight is reflected and concentrated by a reflective parabolic surface of a rearward adjacent reflector element towards the channel 112 and photovoltaic strip 30. The reflective side walls 84 of the channel 112, in use, direct on to the photovoltaic strip 30 sunlight reflected on to them by the rearward adjacent parabolic reflective surface.

Provision of the secondary optic device 118 effectively widens the target band on to which sunlight has to be reflected in order for the sunlight to impinge on the photovoltaic strip 30. Because of this wider target band or target area, the margin for error in tracking the sun is reduced, advantageously allowing for use of less accurate, and therefore less expensive control arrangements. In an example, a photovoltaic device has a tracking margin for error of 2-3°, as opposed to a tracking error of 1° without the secondary optic device 118. The assembly 110 is also more robust due to the secondary optic device 118, as a device having the assembly is less sensitive to misdirection of reflected light owing to warping or relative displacement of component parts of the device.

Furthermore, the concentration factor or ratio may be increased, so that more sunlight is directed on to the photovoltaic strip 30 than would be the case without the secondary optic device 118. In an example, the concentration ratio of a photovoltaic device 80 may be improved from 10 to 20 by the secondary optic device 118. Such greater concentration of sunlight on to the photovoltaic strip 30 results in a reduction in the amount, i.e. the total area, of photovoltaic strip or solar cells needed to generate a given amount of electrical energy, thus increasing the cost effectiveness of a device. It will be appreciated that in example embodiments where the secondary optic device 118 doubles the concentration ratio, the photovoltaic cell area may be halved.

The assembly 110 is removably and/or replaceably mountable on a reflector element comprising a plate member 18 (FIGS. 1 and 2), to permit removal and replacement of the assembly 110 when the lifetime of the photovoltaic strip 30 expires. The assembly 110 can be reconditioned off-site by sliding removal and replacement of the photovoltaic strip 30 from the slot 122. As mentioned above, the photovoltaic strip 30 may be connected to the backing plate 124 by a thermally conductive adhesive. Is to be noted, however, that in other embodiments, the heat sink may be integrally formed with a reflector element, so that it does not form part of any removable and replaceable component.

In FIG. 8, reference numeral 130 indicates another example embodiment of a photovoltaic assembly which incorporates a heat sink 116 and a secondary optic device 118. The assembly 130 is similar in construction and operation to the assembly 110 described with reference to FIG. 7, except that the divergent reflective side walls 84 of the secondary optic device 118 describe a narrower angle between them than is the case in the assembly 110 of FIG. 6.

Figure 9:
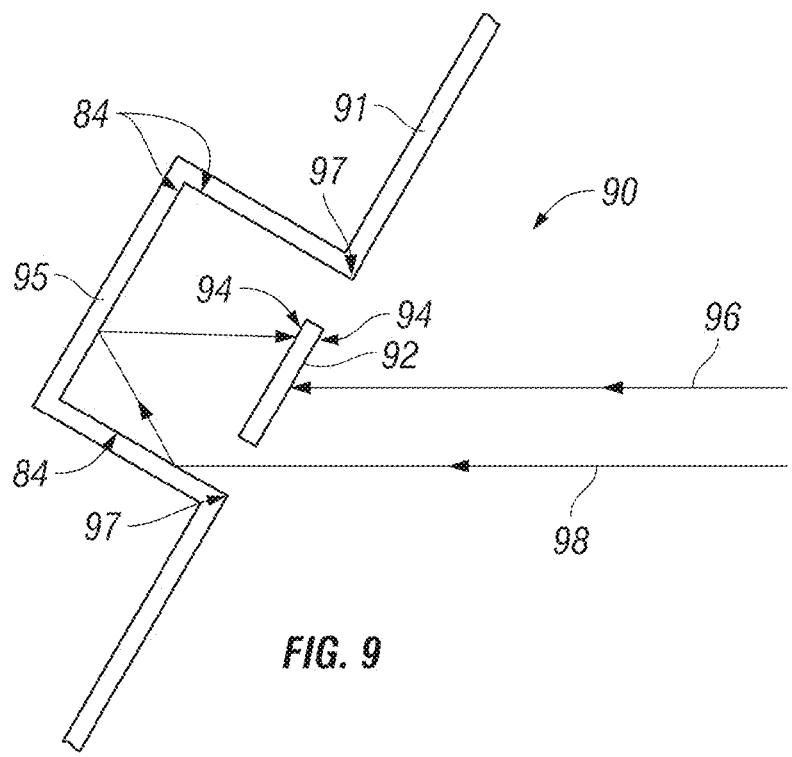
FIG. 9 is an isolated side view of a secondary optic device in accordance with another example embodiment.

FIG. 9 shows another embodiment of a secondary optic device 90, which includes a bifacial photovoltaic strip 92 and forms part of an extruded reflector element 91. The strip 92 has two oppositely outwardly facing major surfaces 94 which contain solar cells for the conversion of sunlight to electric power. In an option, both major surfaces 94 contain solar cells. Similar to the secondary optic device 118 of FIG. 6, the secondary optic device 90 of FIG. 9 includes a longitudinally extending channel 95 with reflective interior walls 84. In an example, the channel 95 is U-shaped in cross-sectional outline, with orthogonal or perpendicular side walls and a flat base wall.

The bifacial photovoltaic strip 94 is longitudinally aligned with the channel 95 and is mounted centrally in a mouth of the channel 95. The strip 94 is therefore flanked by longitudinally extending openings 97 leading into the interior of the channel 95.

In operation, sunlight reflected and concentrated by an adjacent reflector element 91 may strike an outwardly directed face 94 of the strip 92, or may be reflected by the reflective interior walls 84 of the channel 95 on to the inwardly directed face 94 of the strip 92. This is illustrated with reference to two representative reflected rays numbered 96 and 98 in FIG. 9. Ray 96, for example, falls directly on the outwardly directed face 94 of the strip 92, while ray 98 passes through one of the openings 97 flanking the strip 92, and is reflected first by a side wall 84 and then by the base, so that it impinges on the inwardly directed face 94 of the strip 92. It is to be noted that the particular cross-sectional shape of the channel 95, as well as the positioning of the strip 92, can be varied in other embodiments. For instance, the channel 95 can, in other embodiments, have a true parabolic cross-sectional outline so that the channel 95 forms a parabolic reflector, with the strip 92 being mounted at a focal point of the parabolic reflector.

In other embodiments, a secondary optic device mounted on a reflector element may comprise one or more lenses to concentrate and/or direct reflected sunlight on to a photovoltaic receptor.

Figure 10:
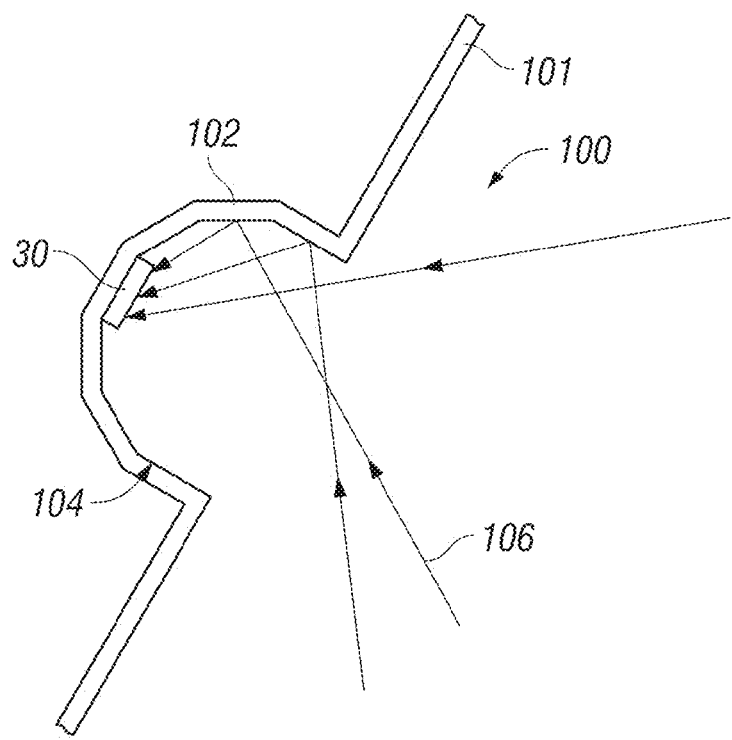
FIG. 10 is an isolated side view of a secondary optic device in accordance with a further embodiment.

FIG. 10 illustrates yet a further embodiment of a secondary optic device 100 forming part of a reflector element 101. The secondary optic device 100 of FIG. 10 is similar in configuration to the secondary optic device 118 of FIGS. 6 and 7. In the embodiment of FIG. 10, a channel 102 of the secondary optic device 100 has a segmented, curved U-shaped cross-sectional outline, roughly approximating a parabolic curve. As illustrated in FIG. 10, the channel 102 has reflective interior walls 104 to reflect sunlight 106 received from an adjacent reflector element 101 onto the photovoltaic strip 30 located at a base of the channel 102. It is to be noted that the secondary optic devices of FIGS. 9 and 10 can be incorporated in modular photovoltaic assemblies similar to those of FIGS. 6-8, or they can instead be structurally incorporated in a reflector element.

Figure 11:
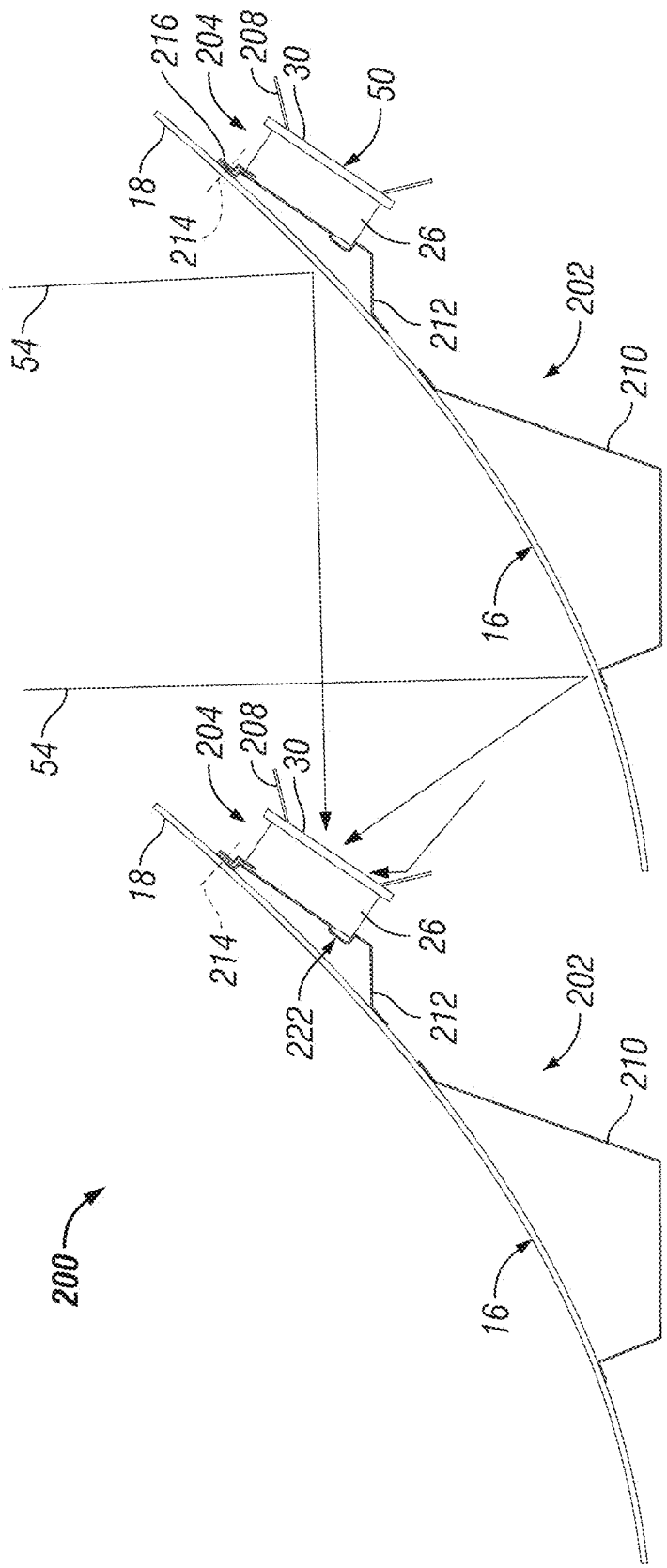
FIG. 11 is a side view of a photovoltaic device in accordance with yet a further example embodiment.

In FIG. 11, reference numeral 200 indicates a photovoltaic device in accordance with a further example embodiment. The device 200 again includes a series of reflector elements 202 (only two of which are shown), each reflector element 202 being formed of a flexible metal plate member 18 with a reflective surface 16. In the embodiment of FIG. 11, each plate member 18 is connected to a support bracket 210 to support the plate member 18 and to give the plate member 18 a curved profile in end view, so that the reflective surface 16 is concavely curved for reflecting incident sunlight 54 on to the adjacent reflector element 202. The support bracket 210 thus keeps the plate member 18 in flexion, giving it the desired shape. The support bracket 210 is formed of bent plate metal.

Each reflector element 202 further includes a mounting bracket 212 on which a photovoltaic assembly 204 is mounted for ready removal and replacement. Similar to the support bracket 210, the mounting bracket 212 is fastened to the plate member 18 such that it is oriented horizontally, running along the length of the plate member 18. The mounting bracket 212 has a shallow, skewed U-shaped profile when seen in end view, being connected to the plate member 18 along its opposed side edges. Because the operatively upper leg of the mounting bracket 212's U-shaped profile is shorter than the opposed, operatively lower leg, the assembly 204 is somewhat tilted about its longitudinal axis relative to the registering portion of the plate member 18. The mounting bracket 212 is therefore shaped such that the assembly 204 is oriented to present its active face 50 more squarely to the rearward adjacent reflector element 202. The mounting bracket 212 also spaces the modular photovoltaic assembly 204 from the plate member 18, so that there is an air gap between the plate member 18 and a central portion of the mounting bracket 212, against which the photovoltaic assembly 204 bears.

The modular photovoltaic assembly 204 is fastened to the mounting bracket 212 by a stepped clamping member 216 which is bolted to the plate member 18. Connection of the assembly 204 to the mounting bracket 212 is described in greater detail below with reference to FIG. 12.

The photovoltaic assembly 204 is largely similar in construction and function to the photovoltaic assembly 20 described with reference to FIGS. 1-5. Like reference numerals indicate like parts in FIGS. 1-5 and in FIGS. 11-12, unless otherwise indicated. However, the modular assembly 204 includes a secondary optic device in the form of divergent secondary reflectors 208 projecting outwardly and flanking the photovoltaic strip 30.

Figure 12:
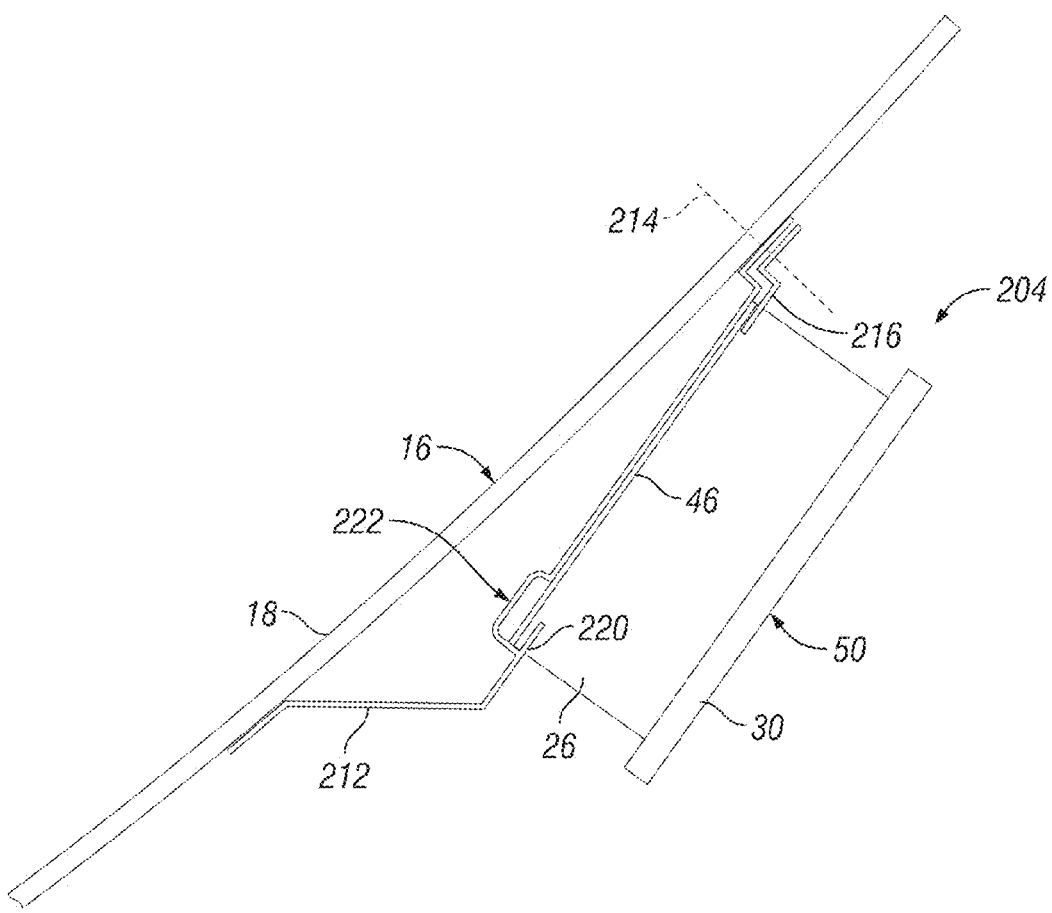
FIG. 12 is an exploded partial side view of a photovoltaic device in accordance with an example embodiment.

In FIG. 12, reference numeral 204 indicates a modular photovoltaic assembly similar to that of FIG. 11, with the exception that the secondary reflectors 208 are omitted. As can be seen in FIG. 12, the mounting bracket 212 includes a mounting recess 222 receiving a lower side edge of a stiffening plate 46 forming part of the heat sink 26 of the modular assembly 204. The recess 222 is elongated, running along the length of the mounting bracket 212. A restraining ledge or lip 220 projects over a lower edge of the recess 222, to keep the stiffening plate 46 of the modular assembly 204 in position, anchoring it against movement away from the mounting bracket 212 under gravity.

At the upper edge of the mounting bracket 212, the clamping member 216 is bolted to the plate member 18 by a bolt indicated schematically by reference numeral 214. The stiffening plate 46 of the modular assembly 204 is clamped between the clamping member 216 and the mounting bracket 212, thus holding the upper edge of the modular assembly 204 in position. The reflector element 202 may include a series of clamping members 216 spaced along the length of the mounting bracket 212, each clamping member 216 being fastened to the plate member 18 by a respective bolt 214. Instead, the clamping member 216 may be a single elongate element or bar with prongs meshing with the fins 40 of the heat sink 26 and being fastened to the plate member 18 by a longitudinally extending series of bolts 214.

In operation, the modular photovoltaic assembly 204 is connected to mounting bracket 212 by first inserting the lower edge of the modular assembly 204 into the recess 222, and then pivoting the modular assembly 204 upwards such that the stiffening plate 46 bears against the mounting bracket 212. Thereafter, the clamping member 216 is positioned such that it sandwiches the stiffening plate 46 between the clamping member 216 and the mounting bracket 212, after which the clamping member 216 is fastened in position by passing the bolts 214 through corresponding registering holes (not shown) in the clamping member 216 and the plate member 18, and tightening complementary nuts received on the bolts 214. When thus connected, the modular assembly 204 is held in position securely by the lip 220 and the clamping member 216. The mounting bracket 212 thus serves to facilitate removable and replaceable connection of the modular assembly 204 to the plate member 18, as well as holding the modular assembly 204 in a preferred orientation relative to the rearward adjacent reflector element 202. Additionally, the mounting bracket 212 spaces the modular assembly 204 from the plate member 18, thus inhibiting heat transfer from the plate member 18 to the modular assembly 204. Conductive heating of the photovoltaic strip 30 is of course further inhibited by operation of the heat sink 26.

When the photovoltaic strip 30 requires replacement, the modular assembly 204 is removed, as a unit, and replaced with a fresh replacement modular assembly 204. The modular assembly 204 is removed by unfastening the bolts 214 and removing the clamping member 216, allowing removal of the lower edge of the modular assembly 204 from the recess 222.

A photovoltaic device, a mounting unit, and a method of converting solar radiation to electrical power have been described. Although the embodiments have been described with reference to specific example embodiments, it will be evident that various modifications and changes may be made to these embodiments without departing from the broader scope of the invention. Accordingly, the specification and drawings are to be regarded in an illustrative rather than a restrictive sense.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A photovoltaic device comprising:
   an array of elongate reflector elements mounted substantially parallel to one another and transversely spaced in series, at least one of the reflector elements having an elongate concave reflective surface disposed towards a forward adjacent reflector element in the array; and
   a photovoltaic assembly mounted on an associated one of the reflector elements, the photovoltaic assembly comprising:
      a mounting arrangement in engagement with the associated reflector element such that the photovoltaic assembly is removably and replaceably mounted on the associated reflector element;
      a photovoltaic receptor connected to the mounting arrangement to receive reflected solar radiation from a rearward adjacent reflector element; and
      a heat sink in heat transfer relationship with the photovoltaic receptor, thermally isolating the photovoltaic receptor, at least partially, from the associated reflector element.

2. The device according to claim 1, wherein the photovoltaic receptor is spaced from the associated reflector element, providing a convection gap between the associated reflector element and the photovoltaic receptor, the heat sink being located, at least partially, in the convection gap.

3. The device according to claim 2, wherein the photovoltaic receptor is mounted adjacent an operatively upper edge of the associated reflector element.

4. The device according to claim 2, wherein the heat sink comprises a set of cooling fins which are substantially parallel to one another and are transversely spaced in series along a length of the reflector element, the cooling fins lying in respective planes transverse to the length of the reflector element.

5. The device according to claim 4, wherein the photovoltaic receptor is an elongate photovoltaic strip, the photovoltaic assembly including an elongate holder engaged with the photovoltaic strip, the photovoltaic assembly further including a thermal expansion arrangement.

6. The device according to claim 5, wherein the holder comprises a series of holder sections longitudinally aligned and arranged end-to-end in series along the length of the photovoltaic strip, adjacent ends of neighboring holder sections spaced by an expansion gap.

7. The device according to claim 6, wherein two or more of the holder sections are fast with a plurality of the cooling fins, the cooling fins being anchored at their proximal ends to a base and the two or more holder sections respectively connected to distal ends of the associated cooling fins.

8. The device according to claim 1, wherein the reflector element comprises a plate member of plate metal, an operatively upper face of the plate member providing the reflective surface and an operatively lower face of the plate member, the reflector element further comprising a mounting bracket connected to an operatively lower face of the plate member, the photovoltaic assembly being mounted on the mounting bracket.

9. The device according to claim 1, wherein at least one of the reflector elements has a secondary optic device directing solar radiation reflected from a rearward adjacent reflector element to the associated photovoltaic receptor.

10. The device according to claim 9, wherein the secondary optic device comprises at least one secondary reflector fast with the associated reflector element.

11. The device according to claim 10, wherein the photovoltaic receptor extends longitudinally along the associated reflector element, the secondary optic device including secondary reflectors bordering the photovoltaic receptor and extending along opposite sides of the photovoltaic receptor.

12. The device according to claim 10, wherein the secondary optic device forms part of the removable and replaceable photovoltaic assembly.

13. An assembly comprising:
   a mounting arrangement to removably and replaceably mount the assembly on a reflector element forming part of an array of elongate reflector elements mounted substantially parallel to one another and transversely spaced in series, at least one of the reflector elements having an elongate concave reflective surface to reflect solar radiation on to a photovoltaic receptor mounted on an adjacent reflector element in the array;
   a photovoltaic receptor fast with the mounting arrangement; and
   a heat sink in heat transfer relationship with the photovoltaic receptor, thermally isolating the photovoltaic receptor, at least partially, from the mounting arrangement.

14. The assembly according to claim 13, wherein the mounting arrangement includes a snapfit formation engageable with a complementary snapfit formation on the reflector element.

15. The assembly according to claim 13, further comprising a secondary optic device oriented to direct solar radiation to the photovoltaic receptor.

16. A method of converting solar radiation to electrical power, the method comprising:
   removably and replaceably mounting a photovoltaic assembly on a reflector element in an array of substantially parallel transversely spaced reflector elements, the photovoltaic assembly comprising:
      a mounting arrangement engageable with the reflector element to mount the photovoltaic assembly thereon;
      a photovoltaic receptor; and
      a heat sink in heat transfer relationship with the photovoltaic receptor;

reflecting sunlight on to the photovoltaic receptor by use of an elongate concave reflective surface forming part of an adjacent reflector element in the array; and cooling the photovoltaic receptor by use of the heat sink forming part of the photovoltaic assembly, the heat sink at least partially isolating the photovoltaic receptor thermally from the reflector element.

17. The method according to claim 16, further comprising removing the photovoltaic assembly from the reflector element and mounting a replacement photovoltaic assembly on the reflector element.

18. The method according to claim 17, wherein the photovoltaic assembly includes a photovoltaic receptor holder which holds the photovoltaic receptor, the method further comprising, after removing the photovoltaic assembly from the reflector element, removing the photovoltaic receptor from the photovoltaic receptor holder, and engaging a replacement photovoltaic receptor with the photovoltaic receptor holder.

19. A photovoltaic device comprising:

an array of elongate reflector elements mounted substantially parallel to one another and transversely spaced in series, at least one of the reflector elements having an elongate concave reflective surface disposed towards a concentrating zone located above the reflective surface; and a photovoltaic assembly mounted on a supporting member, the photovoltaic assembly including a photovoltaic receptor held by the supporting member in the concentrating zone, and a heat sink in heat transfer relationship with the photovoltaic receptor, at least partially isolating the photovoltaic receptor thermally from the supporting member.

* * * * *